(12) United States Patent
Hashimoto et al.

(10) Patent No.: US 6,643,060 B2
(45) Date of Patent: Nov. 4, 2003

(54) MULTI-WAVELENGTH LIGHT SOURCE UTILIZING ACOUSTO-OPTIC TUNABLE FILTER

(75) Inventors: Naoki Hashimoto, Kawasaki (JP); Tadao Nakazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 10/029,987

(22) Filed: Dec. 31, 2001

(65) Prior Publication Data

US 2002/0196532 A1 Dec. 26, 2002

(30) Foreign Application Priority Data

Jun. 7, 2001 (JP) ......................................... 2001-173099

(51) Int. Cl.$^7$ ............................................... H01S 3/00
(52) U.S. Cl. ..................................................... 359/346
(58) Field of Search ........................................... 359/346

(56) References Cited

U.S. PATENT DOCUMENTS

| 3,935,566 | A | * | 1/1976 | Snopko | ................... | 340/173 R |
| 6,201,638 | B1 | * | 3/2001 | Hall et al. | ................... | 359/346 |
| 6,331,907 | B1 | * | 12/2001 | Miyazaki et al. | ........... | 359/127 |
| 6,407,855 | B1 | * | 6/2002 | MacCormack et al. | ..... | 359/346 |

FOREIGN PATENT DOCUMENTS

JP          406268309 A  *  9/1994

OTHER PUBLICATIONS

Naoki Hashimoto, et al., "Tunable erbium–doped fiber ring laser acousto–optic tunable filter", Optical Society of America, Jun. 12, 2001.

Seung Kwan Kim, et al., "Wideband multiwavelength erbium–doped fiber ring laser", OFC 2000.

Hideto Sasamori, et al., "Multi–wavelength Erbium–Doped Fiber Ring Light Source With Fiber Grating Filter", OAA 97 WC3, pp. 116–119, 1997.

Antoine Bellemare, et al., "Multifrequency Erbium–Doped Fiber Ring Lasers Anchored on the ITU Frequency Grid", OFC 99, pp. 16–18, 1999.

* cited by examiner

*Primary Examiner*—Mark Hellner
(74) *Attorney, Agent, or Firm*—Staas & Halsey LLP

(57) ABSTRACT

The present invention aims at providing a multi-wavelength light source for stably generating a plurality of oscillated lights of arbitrary wavelengths by a simplified constitution. To this end, the multi-wavelength light source of the present invention is provided with an acousto-optic tunable filter (AOTF) on an optical path of a resonator including an optical amplifier, so that the AOTF selects lights of plural wavelengths from input lights corresponding to multiple surface acoustic waves at different frequencies, respectively, and shifts the frequencies of the selected lights to output the frequency shifted lights to the optical path, thereby realizing the stable multi-wavelength oscillation of lights being propagated within the resonator.

16 Claims, 11 Drawing Sheets

SPECTRUM OF OUTPUT LIGHT

WAVELENGTH

TRANSMISSION WAVELENGTH CHARACTERISTIC OF PERIODIC FILTER 60

WAVELENGTH

FIG.6

WAVELENGTH

OSCILLATING OPERATION AT MULTI-WAVELENGTHS

FIG.14

OSCILLATING OPERATION AT SINGLE WAVELENGTH

FIG.15

RAMAN AMPLIFICATION MEDIUM

SIGNAL LIGHT

EXCITATION LIGHT SOURCE FOR RAMAN AMPLIFICATION

MULTI-WAVELENGTH LIGHT SOURCE ACCORDING TO PRESENT INVENTION

OPTICAL AMPLIFIER

EXCITATION LIGHT OF MULTI-WAVELENGTHS

FIG.16

RELATED ART

PERIODIC FILTER

EDF

EXCITATION LIGHT SOURCE

FIG.17

RELATED ART

FIG.18

RELATED ART

FIG.19
RELATED ART

MULTI-WAVELENGTH LIGHT SOURCE UTILIZING ACOUSTO-OPTIC TUNABLE FILTER

BACKGROUND OF THE INVENTION (1) Field of the Invention

The present invention relates to a multi-wavelength light source for generating a plurality of lights having different wavelengths, and in particular, to a multi-wavelength light source to stably generate lights having arbitrary wavelengths by utilizing an acousto-optic tunable filter (AOTF).

(2) Related Art

With the explosive increase of communication capacities due to the wide-spread of Internet and the like, the introduction of a wavelength division multiplexed (WDM) optical communication system has been proceeded, and the transmission capacities of WDM optical communication systems have now reached a level of 1 tera-bit/second by the densification of communication wavelengths and the broadened bands and the like. In order to construct such a high-density WDM optical communication system, it is required to prepare a number of light sources corresponding to the number of wavelengths of WDM signal lights, thereby resulting in a considerable problem of cost. Thus, there have been eagerly desired inexpensive multi-wavelength light sources. Among these light sources, a multi-wavelength oscillation laser adopting rare earth element-doped fibers has been studied from an early stage, because of the simplified constitution thereof.

Figure 16:
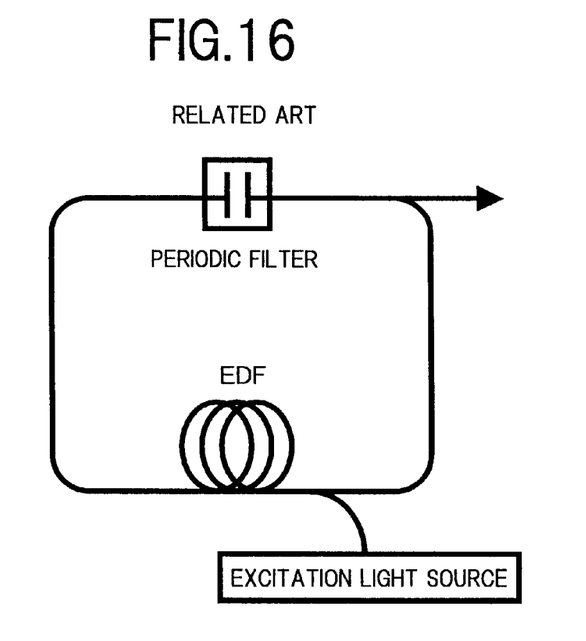
FIG. 16 is a block diagram showing an exemplary constitution of a conventional multi-wavelength oscillation laser.
Figure 17:
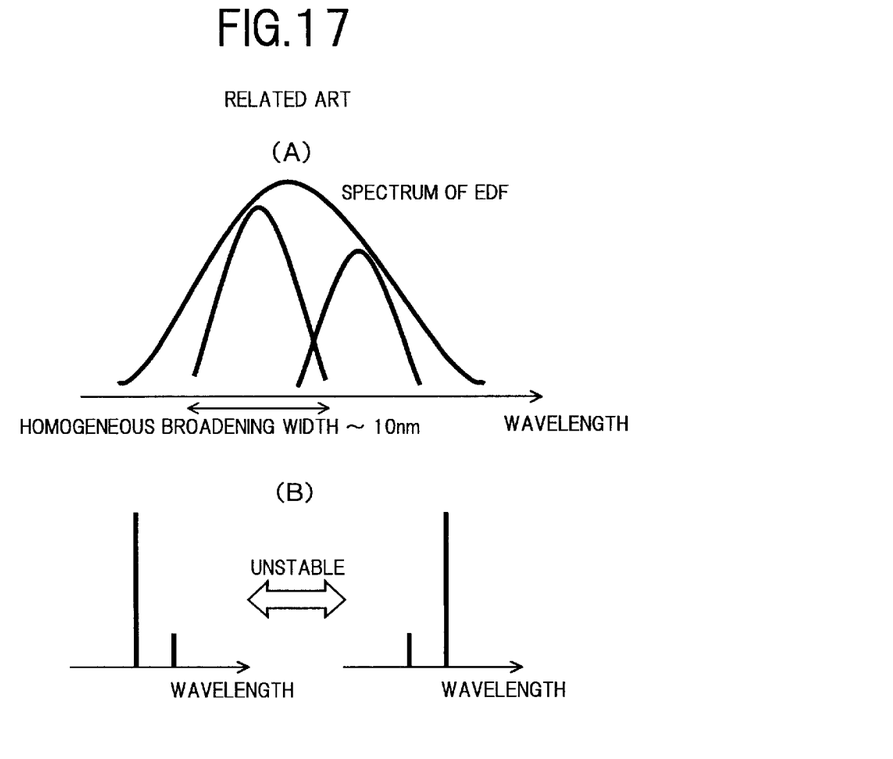
FIG. 17 is a view for explaining an unstable oscillating operation of the multi-wavelength oscillation laser.

As the conventional multi-wavelength oscillation laser, various types of multi-wavelength light sources have been tried by combining optical fiber amplifiers utilizing erbium-doped fibers (EDF's) with periodic filters such as etalons, as shown in FIG. 16. However, in such a multi-wavelength oscillation laser, there is caused inter-mode competition due to the wide homogeneous broadening widths possessed by EDF's as shown in FIG. 17, resulted in that stable multi-wavelength oscillation cannot be obtained. Conventionally, in order to obtain stable multi-wavelength oscillation by means of erbium-doped fibers, there has been adopted a method to narrow the homogeneous broadening widths by cooling the erbium-doped fibers.

Figure 18:
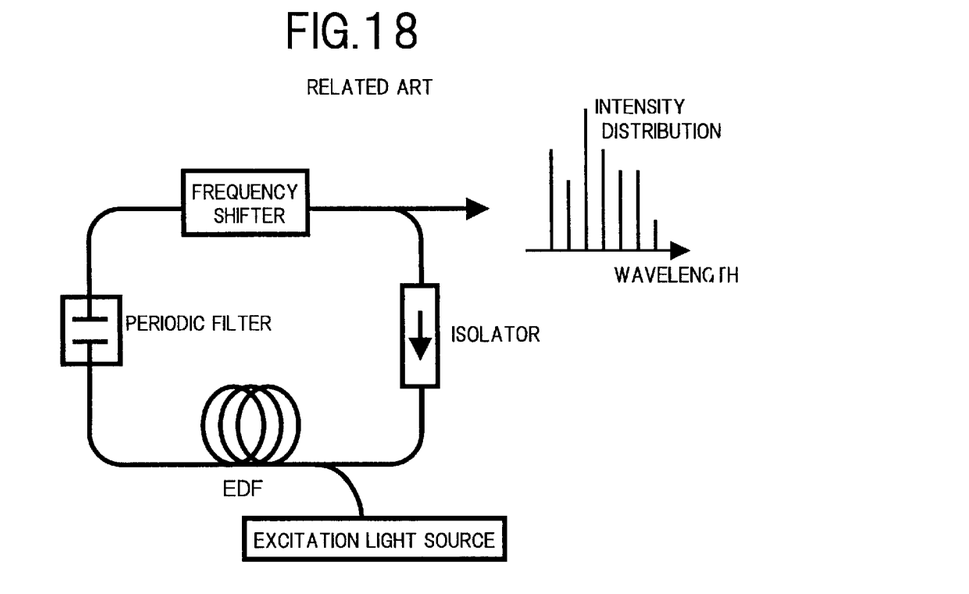
FIG. 18 is a block diagram showing an exemplary constitution of a conventional multi-wavelength light source using a frequency shifter.

Further, there have been proposed those techniques for utilizing a frequency shifter so as to realize the multi-wavelength oscillation at the room temperature by utilizing erbium-doped fibers, such as in the articles: H. Sasamori et al., "Multi-wavelength Erbium-doped Fiber Ring Light Source with Fiber Grating", Technical Digest of Optical Amplifiers and Their Applications (OAA'97), paper WC3, pp. 235–238, 1997; A. Bellemare et al., "Multifrequency erbium-doped fiber ring lasers anchored on the ITU frequency grid", Optical Fiber Conference (OFC'99), paper TuB5, pp. 16–18, 1999; and Seung-Kwan Kim et al., "Wide-band multiwavelength erbium-doped fiber lasers", Optical Fiber Conference (OFC2000), paper ThA3, 2000. Specifically, for example, as shown in FIG. 18, an acousto-optic frequency shifter (AOFS) utilizing acousto-optic effect is inserted into a resonator, such that the frequency of light circulating through the resonator is shifted every circulation by a slight amount so as to prevent the stable oscillation at a single wavelength. As a result, simultaneous oscillations at multi-wavelengths can be obtained without inter-mode competition. Note, the acousto-optic frequency shifter utilizing acousto-optic effect is to collectively convert all of the wavelengths by utilizing Bragg reflection or the like.

Figure 19:
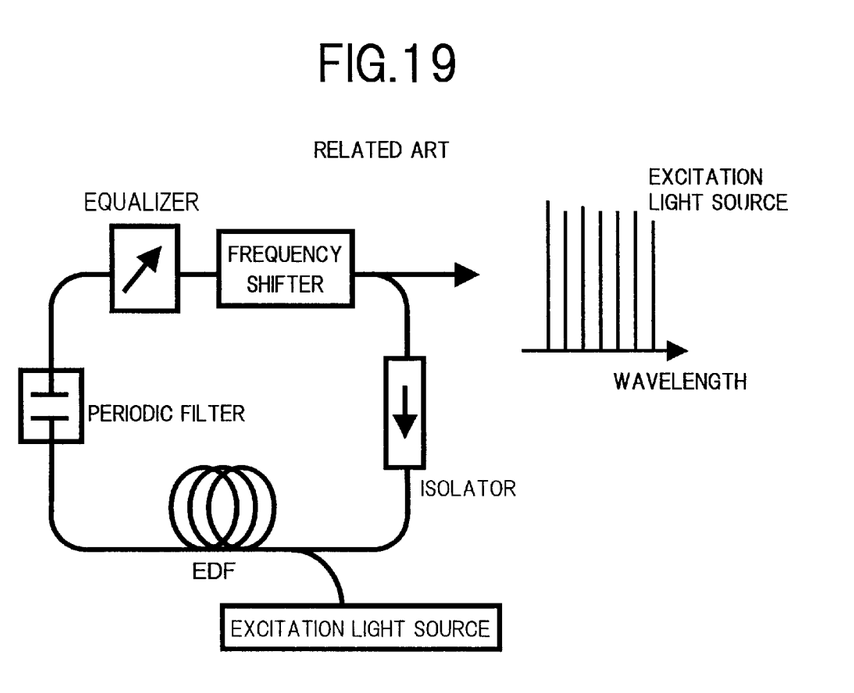
FIG. 19 is a block diagram showing an exemplary constitution in a case of correcting an optical intensity distribution by using an equalizer, in the conventional multi-wavelength light source of FIG. 18.

In a case of multi-wavelength light source utilizing such a frequency shifter, there are caused variations among peak powers of respective wavelengths upon multi-wavelength oscillation, due to gain differences of the erbium-doped fiber, differences of resonator losses or the like, with respect to the respective wavelengths. This requires a device for correcting such variations. As such, in the conventional multi-wavelength light source, for example, as shown in FIG. 19, it has been attempted to flatten the optical intensity distribution, by introducing an equalizer utilizing such as variable attenuators corresponding to the respective wavelengths, in addition to the erbium-doped fiber and the periodic filter such as an etalon.

However, the aforementioned conventional multi-wavelength light source has such defects that the constitution thereof is complicated and that the adjustment of optical powers at respective wavelengths is difficult. Further, the characteristic of the periodic filter is fixed, thereby causing a problem in that it is impossible to obtain oscillation at arbitrary wavelengths.

SUMMARY OF THE INVENTION

The present invention has been achieved in view of the those points as described above, and it is therefore an object of the present invention to provide a multi-wavelength light source capable of stably generating a plurality of oscillated lights of arbitrary wavelengths by a simplified constitution. It is a further object of the present invention to provide a multi-wavelength light source capable of performing such as the adjustment of optical powers at respective wavelengths and the switching of wavelengths at high-speed and at ease.

To achieve the above objects, a multi-wavelength light source according to the present invention provided with an optical amplifier on an optical path of a resonator, for generating lights of plural wavelengths that have been propagated through the resonator and have oscillated, comprises an acousto-optic tunable filter on the optical path of the resonator, wherein the acousto-optic tunable filter selects lights of plural wavelengths from lights input thereto corresponding to frequencies of plural surface acoustic waves at different frequencies, respectively, and shifts the frequencies of the selected lights to output the frequency shifted lights to the optical path.

Conventionally, as described above the acousto-optic frequency shifter (AOFS) that has been used to realize a multi-wavelength light source is to utilize the Bragg reflection or the like, and has a function to collectively shift frequencies of lights in all of the bands. Contrary, the acousto-optic tunable filter to be used in the multi-wavelength light source of the present invention is to utilize the TE/TM mode conversion, and has a strong wavelength-selecting characteristic. Further, the frequency shift in the acousto-optic tunable filter has a characteristic to independently act on the respective selected lights so as to shift the frequencies of the selected lights by amounts of the frequencies of the corresponding surface acoustic waves, respectively.

According to the multi-wavelength light source using such an acousto-optic tunable filter, the lights of plural wavelengths selected at the acousto-optic tunable filter are propagated through the resonator, and the oscillation in a single mode within the resonator is suppressed by the frequency shift caused in each of the selected lights. As a result, it becomes possible to realize the oscillation of lights at multi-wavelengths without inter-mode competition.

Further, although the light wavelengths obtained in the conventional multi-wavelength light source are fixed, the multi-wavelength light source of the present invention is capable of operating at arbitrary multi-wavelengths corresponding to such as frequencies of RF signals to be applied to the acousto-optic tunable filter, and also capable of switching the required number of wavelengths and/or the wavelengths at higher-speed.

Moreover, as a specific constitution of the multi-wavelength light source of the present invention, the resonator may be a ring resonator or a Fabry-Perot resonator. In a case of the ring resonator, it becomes possible to realize the more stable multi-wavelength oscillation by giving the ring resonator a unidirectional constitution having an optical isolator on the optical path. Further, the multi-wavelength light source may be provided with an optical filter having a periodic transmission wavelength characteristic, on the optical path of the resonator. By providing the optical filter, it becomes possible to obtain oscillated lights of multi-wavelengths of narrower bands, and to realize a light source capable of arbitrary multi-wavelength oscillation on a discrete wavelength grid.

The multi-wavelength light source of the present invention preferably comprises an optical power control section for controlling an optical power of each of the lights of plural wavelengths that have been propagated through the resonator and have oscillated. Specifically, the optical power control section may control the optical powers at respective wavelengths by varying the intensities of the plural surface acoustic waves at different frequencies generated at the acousto-optic tunable filter, or by varying losses corresponding to oscillation wavelengths of an equalizer inserted into the optical path of the resonator, respectively. Moreover, the optical power control section may control the optical powers at respective wavelengths in accordance with a detection result by a monitoring section for detecting powers of the lights of plural wavelengths or correction values previously obtained corresponding to combinations of oscillation wavelengths.

By providing such an optical power control section, it becomes possible to control the optical powers at the respective oscillation wavelengths. Particularly, if the intensities of the surface acoustic waves in the acousto-optic tunable filter are controlled, it becomes possible to perform high-speed tuning of optical powers at respective wavelengths.

In the aforementioned multi-wavelength light source, the acousto-optic tunable filter may be constituted such that a plurality of acousto-optic tunable filter elements are connected to each other in multi-stages, so that the sum of frequency shifts of selected lights in the respective acousto-optic tunable filter elements becomes a value other than zero. By using such an acousto-optic tunable filter of multi-staged constitution, it becomes possible to narrow bandwidths of selected lights, and simultaneously therewith to suppress side lobes, to thereby obtain excellent filter characteristics.

It is possible to realize an operation at a single wave by using the aforementioned multi-wavelength light source. However, in the multi-wavelength light source of the present invention, since the single mode oscillation is suppressed by utilizing the frequency shifts, the operation at a single wave becomes theoretically unstable. In order to obtain oscillation at a single wave, it is desirable that the frequency shifts are conducted within the resonator. For example, the frequency shifts can be cancelled by using an acousto-optic tunable filter of two-staged constitution. However, when the frequency shifts are cancelled, it is certainly possible to obtain the stable oscillation in a single mode, but it becomes rather difficult or impossible in turn to obtain an operation at plural wavelengths.

Thus, as a constitution for realizing a single-wavelength operation and a multi-wavelength operation by electrically switching them, the aforementioned acousto-optic tunable filter of the multi-wavelength light source includes a plurality of acousto-optic tunable filter elements connected to each other in multi-stages, and is capable of selectively driving the acousto-optic tunable filter elements, so as to switch between the multi-wavelength oscillation state in which the frequency shifts of selected lights in the driven acousto-optic tunable filter elements become a value other than zero and the single-wavelength oscillation state in which the frequency shifts of selected lights in the driven acousto-optic tunable filter elements become zero. By using such an acousto-optic tunable filter, it becomes possible to realize a light source capable of electrically switching the multi-wavelength oscillating operation and the single-wavelength oscillating operation.

Further objects, features and advantages of the present invention will become more apparent from the following description of preferred embodiments when read in conjunction with the accompanying drawings.

DETAILED DESCRIPTION OF THE INVENTION

There will be described hereinafter embodiments of the present invention, with reference to the accompanying drawings. In respective figures, the same constituent elements are denoted by the same symbols and the description thereof will be omitted.

Figure 1:
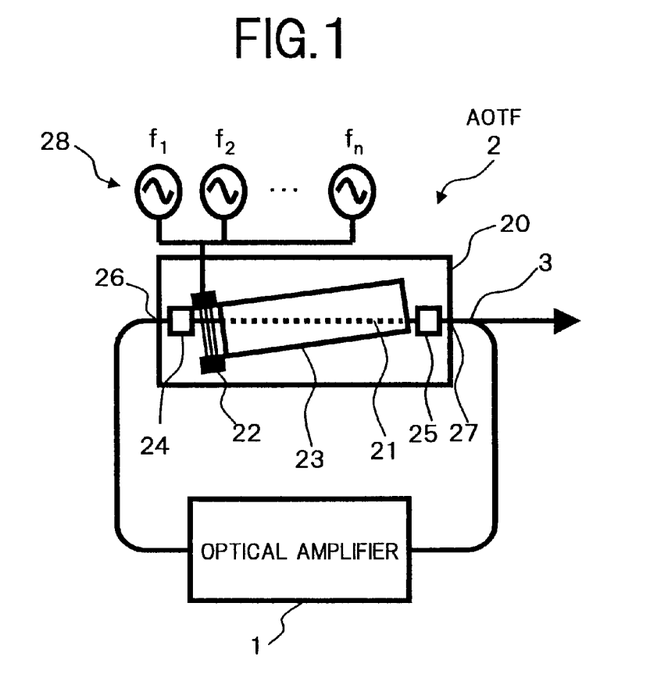
FIG. 1 is a plan view showing a first basic constitution of a multi-wavelength light source according to the present invention.

FIG. 1 is a plan view showing a first basic constitution of a multi-wavelength light source according to the present invention, using an acousto-optic tunable filter.

In FIG. 1, the multi-wavelength light source of the first basic constitution has a configuration of ring resonator made up by optically connecting an optical amplifier 1 and an acousto-optic tunable filter (AOTF) 2 capable of performing a wavelength selection based on the TE/TM mode conversion by surface acoustic waves, to output lights of plural wavelengths to the exterior via an output coupler 3.

The optical amplifier 1 is a typical one capable of amplifying lights of a required wavelength band. Specifically, it is possible to use a known optical amplifying device, such as, an optical fiber amplifier using a rare earth element doped fiber or a semiconductor optical amplifier.

For example, the AOTF 2 comprises a single substrate 20 formed thereon with an optical waveguide 21, an interdigital transducer (IDT) 22, an SAW guide 23, and mode branching devices 24, 25.

The optical waveguide 21 is provided with an input port 26 and an output port 27 at opposite ends thereof, respectively, so as to propagate an output light from the optical amplifier 1 that is input to the optical waveguide 21 via the input port 26 toward the output port 27.

The IDT 22 is applied with RF signals at frequencies $f_1$, $f_2$, ..., $f_n$ generated at an RF signal generating circuit 28, to generate surface acoustic waves (SAW's) corresponding to the respective RF signals. The surface acoustic waves generated by the IDT 22 are propagated on the surface of the substrate 20 along the SAW guide 23. In the example of FIG. 1, the constitution is such that the IDT 22 is arranged at the input port 26 side, and the SAW guide 23 is disposed to extend from the IDT 22 up to the output port 27 side in a manner substantially along the optical waveguide 21, so that the surface acoustic waves are propagated in the same direction (i.e., forward direction) as the light propagation direction within the optical waveguide 21. Here, there is adopted a constitution wherein the longitudinal direction of the SAW guide 23 is set to be inclined from the optical axis of the optical waveguide 21 by a required amount, so that the propagation axis of the surface acoustic waves and the optical axis are crossed at a slant angle, to weight in the longitudinal direction the intensities of surface acoustic waves to be sensed by the lights, thereby suppressing the side lobe level for transmission wavelength characteristics of the AOTF.

The mode branching device 24 is inserted into the optical waveguide 21 positioned between the input port 26 and IDT 22, to transmit only one of the TE mode components and TM mode components for the lights input thereto. The mode branching device 25 is inserted into the optical waveguide 21 positioned between an output side end of the SAW guide 23 and the output port 27, to transmit only the other mode components different from the transmission mode of the mode branching device 24, for the lights input thereto.

The output coupler 3 is connected to the output port 27 of the AOTF 2, for example, and branches a part of the light circulating within the ring resonator to output the branched part to the exterior. Here, the output coupler 3 has been inserted between the output port 27 of the AOTF 2 and an input port of the optical amplifier 1. However, the arrangement of the output coupler 3 is not limited thereto, and it is possible to arrange the output coupler 3 at an arbitrary position on the optical path within the ring resonator.

Next, there will be described an operation of the multi-wavelength light source having the first basic constitution.

In this multi-wavelength light source, amplified spontaneous emission (ASE) lights generated in the optical amplifier 1 that has been excited are input to the input port 26 of the AOTF 2. Among the lights input to the AOTF 2, only the light component in the TE mode (or TM mode) is divided by the mode branching device 24 to be introduced to a section where the IDT 22 and SAW guide 23 of the optical waveguide 21 are positioned (hereinafter called "mode coupling section").

In the mode coupling section, the surface acoustic waves induced by the IDT 22 are propagated along the SAW guide 23 so as to couple to the lights being propagated through the optical waveguide 21, such that only the lights having wavelengths corresponding to the frequencies of the surface acoustic waves, respectively, (hereinafter called "selected light") are converted from the TE mode to TM mode (or from the TM mode to the TE mode). Here, the selected lights of wavelengths in "n" number are subjected to mode conversion, in response to the RF signals at the frequencies $f_1$ to $f_n$, respectively, to be applied to the IDT 22.

At the aforementioned mode conversion, the frequency of each of the selected lights is changed by an amount of the frequency of the corresponding surface acoustic wave, by Doppler shift. It is known that the direction of frequency shift of the selected light depends on the mode converting direction; and the relative propagation directions between the surface acoustic wave and the light; as shown in the following Table 1:

TABLE 1

| | | Direction of Mode Conversion | |
|---|---|---|---|
| | | TE → TM | TM → TE |
| Relative Propagation Direction between SAW and Light | Forward Direction | +f | −f |
| | Reverse Direction | −f | +f |

In Table 1, "f" is a shift amount of frequency, and shift directions are represented by positive and negative signs assigned to the respective shift amounts. Here, both of the surface acoustic wave and the light are propagated in the forward direction. Thus, in a case of the conversion from the TE mode to the TM mode, the frequency of selected light is shifted by an amount of +f, whereas the frequency of selected light is shifted by an amount of −f in a case of the conversion from the TM mode to the TE mode.

Then, at the mode branching device 25 positioned on the output side of the AOTF 2, only the selected lights of the wavelengths that have been subjected to the mode conversion and the Doppler shift are branched, and the selected lights having passed through the mode branching device 25 are output from the output port 27. The lights from the AOTF 2 are fed back via the output coupler 3 to the optical amplifier 1, to be amplified, and then again sent to the AOTF 2.

In this way, circulated within the ring resonator are the lights of wavelengths in "n" number that have been selected at the AOTF 2 in response to the frequencies $f_1$ to $f_n$ of the RF signals, respectively. Also, by virtue of the Doppler shift caused in the AOTF 2 for each selected light, the oscillation in a single mode within the ring resonator is suppressed, to thereby realize the oscillation of multi-wavelength light.

The multi-wavelength light source having the aforementioned first basic constitution can realize, by a single AOTF 2, both functions equivalent to the periodic filter and frequency shifter in the conventional constitution such as shown in FIG. 16 and FIG. 18, thereby enabling of stable multi-wavelength oscillation with a simple constitution. Further, the output light wavelengths of the multi-wavelength light source can be set appropriately corresponding to the frequencies of the RF signals to be applied to the IDT 22 of the AOTF 2, thereby enabling to obtain plural oscillated lights of arbitrary wavelengths.

Next, there will be described a second basic constitution of the multi-wavelength light source using the AOTF according to the present invention.

Figure 2:
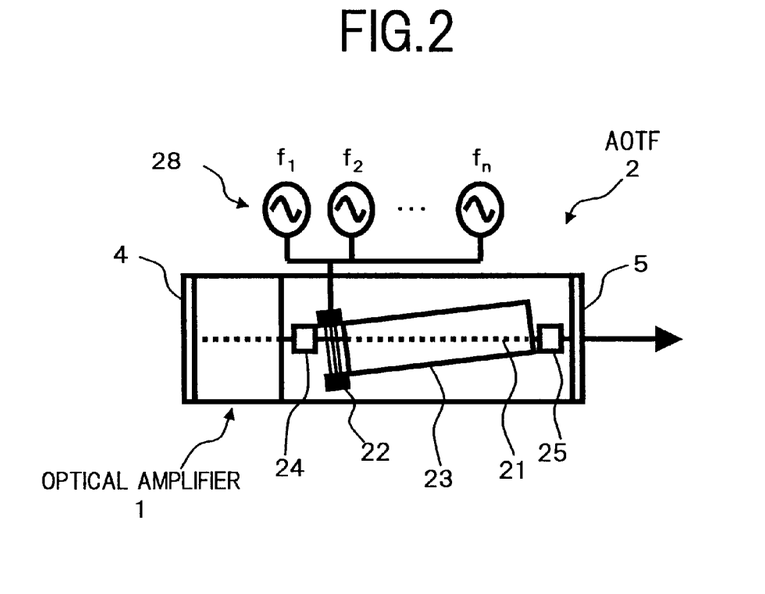
FIG. 2 is a plan view showing a second basic constitution of a multi-wavelength light source according to the present invention.

FIG. 2 is a plan view showing a multi-wavelength light source having the second basic constitution.

In FIG. 2, this multi-wavelength light source has a configuration of Fabry-Perot resonator wherein one end of the optical amplifier 1 and one end of AOTF 2 are optically connected to each other, and reflecting sections 4, 5 formed at the other ends of the optical amplifier 1 and AOTF 2, respectively, such that the lights of plural wavelengths are output to the exterior via the reflecting section 5.

The optical amplifier 1 and AOTF 2 have the same constitutions as those in the first basic constitution. The reflecting section 4 to be formed at the optical amplifier 1 side is to totally reflect the lights emitted from the other end of the optical amplifier 1, thereby returning the reflected lights to the optical amplifier 1. The reflecting section 5 to be formed on the AOTF 2 side reflects the lights emitted from the other end of the AOTF 2 with a high reflectance, thereby returning the reflected lights to the AOTF 2 while outputting the transmitted lights to the exterior of the Fabry-Perot resonator.

In FIG. 2, for one example, a constitution wherein the optical amplifier 1 with the AOTF 2 are integrated is illustrated. Specifically, in such a constitution, by using, for example, a semiconductor optical amplifier (SOA) having wider homogeneous broadening widths as the optical amplifier 1, it becomes possible to achieve the integration of the optical amplifier 1 with the AOTF 2. However, the second basic constitution of the present invention is not limited to the above example, and one ends of the optical amplifier 1 and AOTF 2 individually provided may be optically connected to each other.

In the multi-wavelength light source having the aforementioned configuration of Fabry-Perot resonator, similarly to the first basic constitution, the amplified spontaneous emission lights generated in the optical amplifier 1 are input to the one end of the AOTF 2, and the selected lights of wavelengths in "n" number that have been subjected to mode conversion and Doppler-shift are output from the other end of the AOTF 2 after passing through the mode branching device 25. Among the selected lights having reached the other end of the AOTF 2, the most of them are reflected by the reflecting section 5 and returned to the AOTF 2. Then, the reflected lights from the reflecting section 5 are sent to the mode coupling section after passing through the mode branching device 25 to be again subjected to mode conversion and Doppler-shift, and then pass through the mode branching device 24 to be output to the optical amplifier 1 from the one end of the AOTF 2.

Here, the mode conversion and Doppler shift to which the lights reciprocating within the AOTF 2 are subjected will be described specifically.

Considering, for example, a situation where the mode branching device 24 positioned on the optical amplifier 1 side is set to branch the TE mode components, while the mode branching device 25 positioned on the reflecting section 5 side is set to branch the TM mode components, the lights input to the AOTF 2 from the optical amplifier 1 are propagated through the mode coupling section in the forward direction relative to the propagation direction of the surface acoustic waves, so that the lights at the frequencies corresponding to the surface acoustic waves, respectively, are converted from the TE mode into the TM mode. The Doppler shift to be caused at this mode conversion shifts the frequency of each of the selected lights by an amount of +f as shown in the aforementioned Table 1. The respective selected light, which have been converted into the TM mode and subjected to the Doppler shift by +f, pass through the mode branching device 25 to be reflected by the reflecting section 5, and are returned to the AOTF 2 while maintaining the TM mode and again pass through the mode branching device 25. The returned lights in the TM mode having passed through the mode branching device 25 are propagated through the mode coupling section in the reverse direction relative to the propagation direction of the surface acoustic waves, so that the lights at the frequencies corresponding to the surface acoustic waves, respectively, are again converted from the TM mode into the TE mode. The Doppler shift to be caused at this second time mode conversion shifts the frequency of each of the selected lights again by +f as shown in the aforementioned Table 1. Then, the selected lights having been again converted into the TE mode and having been twice subjected to the Doppler shift pass through the mode branching device 24 to be sent to the optical amplifier 1.

In this way, the lights to be selected by reciprocating within the AOTF 2 are subjected to the Doppler shift in the same directions at the mode conversion, so that the frequency shifts are no way cancelled. Thus, also in the AOTF 2 having the configuration of the Fabry-Perot resonator, there can be realized the function equivalent to the frequency shifter in the conventional constitution.

As described above, the lights of respective wavelengths having reciprocated within the AOTF 2 are input to the optical amplifier 1 to be totally reflected by the reflecting section 4, and again sent to the AOTF 2 after amplified while reciprocating through the optical amplifier 1. Thus, the lights of wavelengths in "n" number selected at the AOTF 2 in response to the frequencies $f_1$ to $f_n$ of the RF signals, respectively, reciprocate through the Fabry-Perot resonator, and also, by virtue of the Doppler shift caused in the AOTF 2 for each selected light, the oscillation in a single mode within the Fabry-Perot resonator is suppressed, to thereby realize the oscillation of multi-wavelength light.

In this way, also in the multi-wavelength light source having the second basic constitution, similarly to the effect in the aforementioned first basic constitution it becomes possible to perform the stable multi-wavelength oscillation with a simplified constitution thereby enabling to obtain plural oscillated lights of arbitrary wavelengths.

Figure 3:
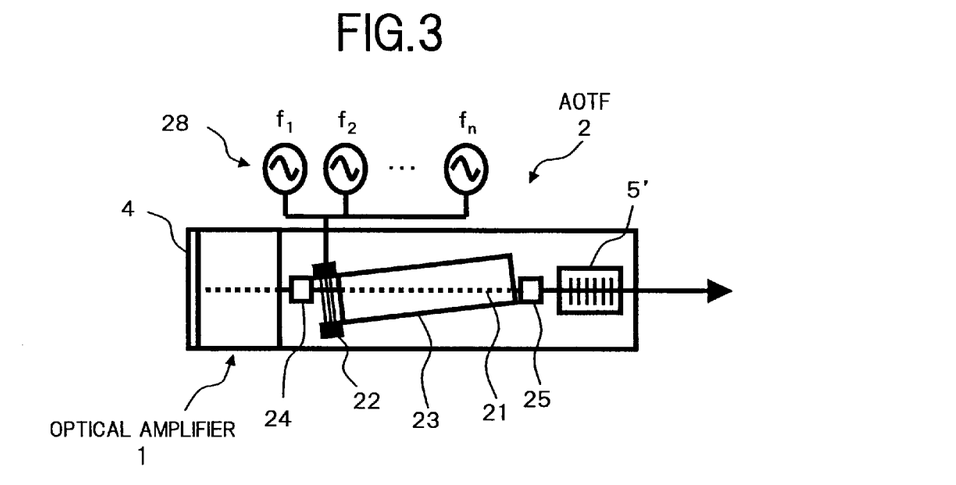
FIG. 3 is a plan view showing another exemplary constitution concerning the second basic constitution.

In the second basic constitution, the reflecting section 5 having the required reflectance has been formed at the other end of the AOTF 2. However, instead of the reflecting section 5, for example, as shown in FIG. 3, a long-period grating 5' having a reflection characteristic corresponding to the selected wavelength band of the AOTF 2 may be formed on the waveguide at the end of the AOTF 2.

Next, there will be described specific embodiments of multi-wavelength light sources using the AOTF's according to the present invention, respectively. In the following embodiments, the multi-wavelength light sources each having the aforementioned first basic constitution shall be specifically described. Specific embodiments of the multi-wavelength light sources each having the aforementioned second basic constitution can be considered in the same manner as the first basic constitution, and the explanation thereof shall be omitted.

Figure 4:
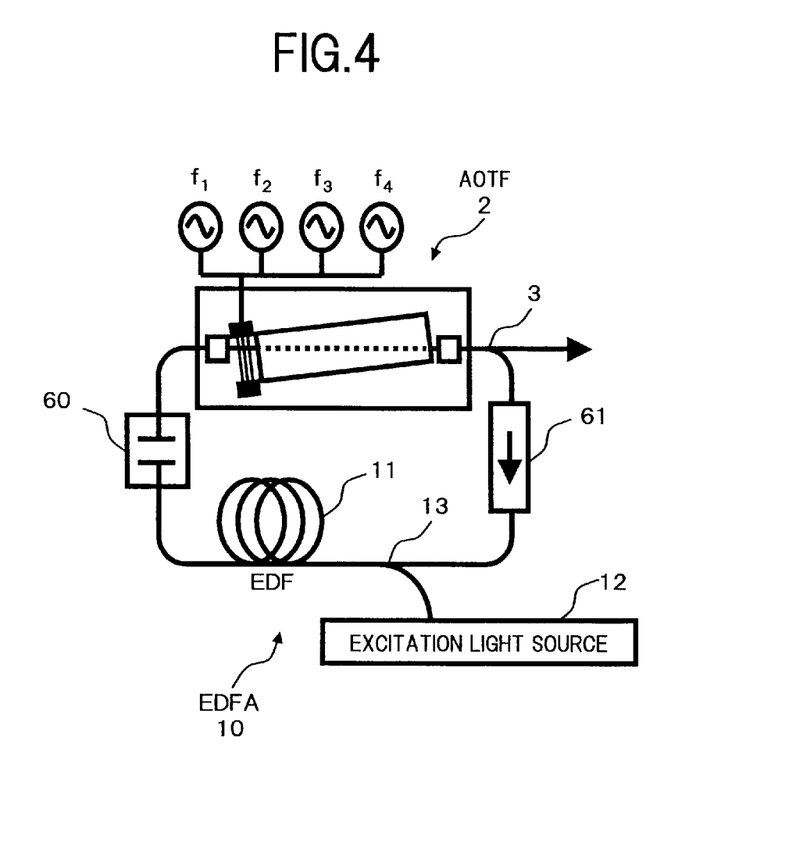
FIG. 4 is a plan view showing a constitution of an embodiment (1) of a multi-wavelength light source according to the present invention.

FIG. 4 is a plan view showing a constitution of an embodiment (1) of a multi-wavelength light source according to the present invention.

In FIG. 4, the multi-wavelength light source of the embodiment (1) is constituted such that, for example, an erbium-doped optical fiber amplifier (EDFA) 10 is used as the optical amplifier 1, and a periodic filter 60 and an optical isolator 61 are inserted into the optical path of the ring resonator, in the first basic constitution shown in FIG. 1. Note, the AOTF 2 and output coupler 3 have the same constitutions as those explained in the first basic constitution.

The EDFA 10, for example, includes an erbium-doped optical fiber (EDF) 11 connected to the optical path of the ring resonator, an excitation light source 12 for generating an excitation light at a required wavelength and a WDM coupler 13 for supplying the excitation light to the EDF 11. It is assumed that this EDFA 10 has an amplification band wider than that of the selected lights in the AOTF 2. Note, the constitution of EDFA usable as the optical amplifier 1 is not limited to that of the above embodiment, and it is possible to apply a known EDFA as the optical amplifier 1.

Figure 5:
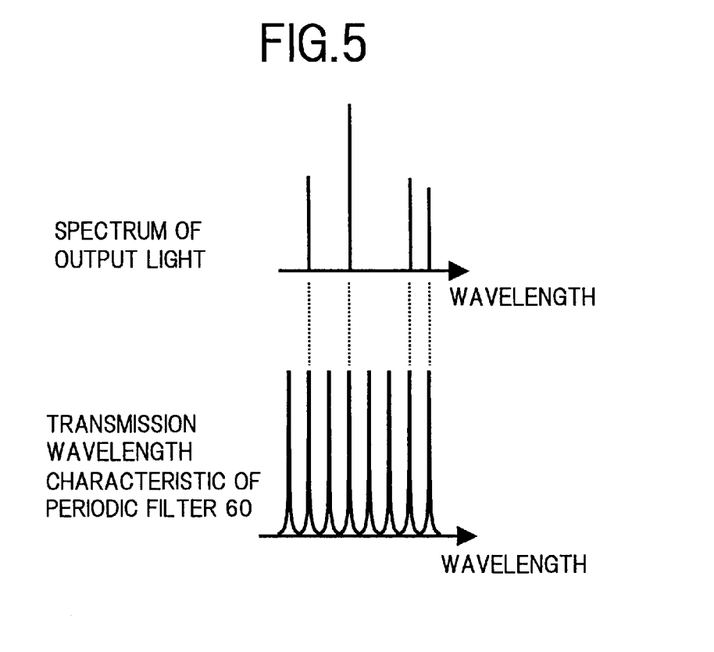
FIG. 5 is a view showing an exemplary spectrum of output light and an exemplary transmission wavelength characteristic of a periodic filter in the embodiment (1)

For example, as shown at the lower section of FIG. 5, the periodic filter 60 is an optical filter having a transmission wavelength characteristic corresponding to a discrete wavelength grid. Each bandwidth of the periodic transmission bands of the periodic filter 60 is set to be narrower than the bandwidth of each light to be selected by the AOTF 2. Specifically, it is possible to use, for example, a Fabry-Perot etalon or the like having a narrow bandwidth designed corresponding to the wavelength grid prescribed by ITU. Here, it is assumed that the periodic filter 60 is inserted into the optical path between an output terminal of the EDFA 10 and the input port of the AOTF 2. Note, the inserting position of the periodic filter 60 is not limited to the above, and it is possible to insert it into an arbitrary position on the optical path of the ring resonator.

The optical isolator 61 is to pass the lights only in one direction. Here, it is assumed that this optical isolator 61 is inserted into the optical path between the output coupler 3 and an input end of the EDFA 10. However, the inserting position of the optical isolator 61 is not limited to the above position, and it is possible to insert it into an arbitrary position in the optical path of the ring resonator.

According to the multi-wavelength light source of the embodiment (1) having such a constitution, the periodic filter 60 is inserted into the ring resonator, thereby enabling to narrow the bandwidth of the oscillated lights of respective wavelengths to be selected and amplified by the AOTF 2 and EDFA 10, respectively, and enabling the oscillation of plural lights of arbitrary wavelengths corresponding to the periodic transmission wavelength characteristic of the periodic filter 60. For example, in the AOTF 2, in a case of selecting and oscillating the lights of four wavelengths by applying the RF signals at frequencies $f_1$ to $f_4$ to the IDT 22, it becomes possible to selectively oscillate arbitrary lights at four waves on the required wavelength grid as shown at the upper section of FIG. 5 by appropriately setting the frequencies $f_1$ to $f_4$ of the RF signals corresponding to the transmission wavelength characteristic of the periodic filter 60.

Further, the optical isolator 61 is inserted into the ring resonator so as to constitute the unidirectional resonator. Thus, it becomes possible to realize the more stable multi-wavelength oscillation.

Next, there will be described an embodiment (2) of a multi-wavelength light source according to the present invention.

In the multi-wavelength light source of the above embodiment (1), it is supposed that there may be caused a variation among levels of output lights of respective wavelengths as shown at the upper section of FIG. 5, due to a gain wavelength characteristic of the EDFA 10 and a loss wavelength characteristic of optical parts within the ring resonator. As such, in the embodiment (2), the consideration is given for an application example wherein the aforementioned variation among levels of output lights is corrected, so that lights of multi-wavelengths having uniform levels can be output, respectively.

Figure 6:
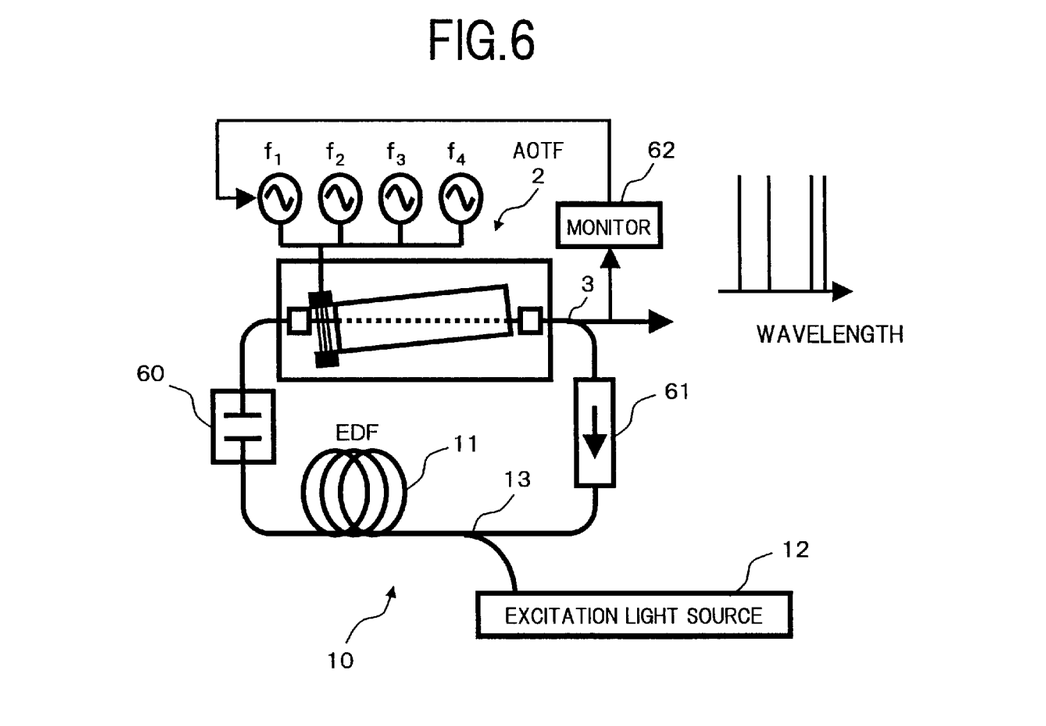
FIG. 6 is a plan view showing a constitution of an embodiment (2) of a multi-wavelength light source according to the present invention.

FIG. 6 is a plan view showing a constitution of the embodiment (2).

In FIG. 6, this multi-wavelength light source is constituted such that, in the constitution of the embodiment (2) shown in FIG. 4, there is disposed a monitor 62 for detecting the levels of output lights of respective wavelengths extracted from the ring resonator to the exterior by the output coupler 3, to control the intensities (amplitudes) of the RF signals at the frequencies $f_1$ to $f_4$ in the AOTF 2, so that the levels of output lights of the respective wavelengths are flattened based on the detection result by the monitor 62.

In such a multi-wavelength light source, the amplitudes of the RF signals are feedback controlled based on the levels of output light of respective wavelengths, so that the intensities of the surface acoustic waves to be generated according to the RF signals is changed, and the levels of lights of respective wavelengths to be selected by the AOTF 2 are adjusted in accordance with the intensities of the corresponding surface acoustic waves, respectively. Thus, the light levels of the respective wavelengths to be oscillated within the ring resonator are flattened, so that lights of multi-wavelengths having uniform levels are output to the exterior via the output coupler 3.

In this way, according to the multi-wavelength light source of the embodiment (2), it is possible to realize the function equivalent to the equalizer in the conventional constitution as shown in FIG. 19, by controlling the amplitudes of the RF signals of the AOTF 2. Accordingly, it becomes possible to realize, by the single AOTF 2, the three functions of the periodic filter, frequency shifter and equalizer in the conventional constitution, thereby enabling to output lights of multi-wavelengths having a flattened optical intensity distribution by a more simplified constitution. Further, the RF signal control of the AOTF 2 can be readily performed, thereby enabling high-speed tuning of the levels of output lights.

Figure 7:
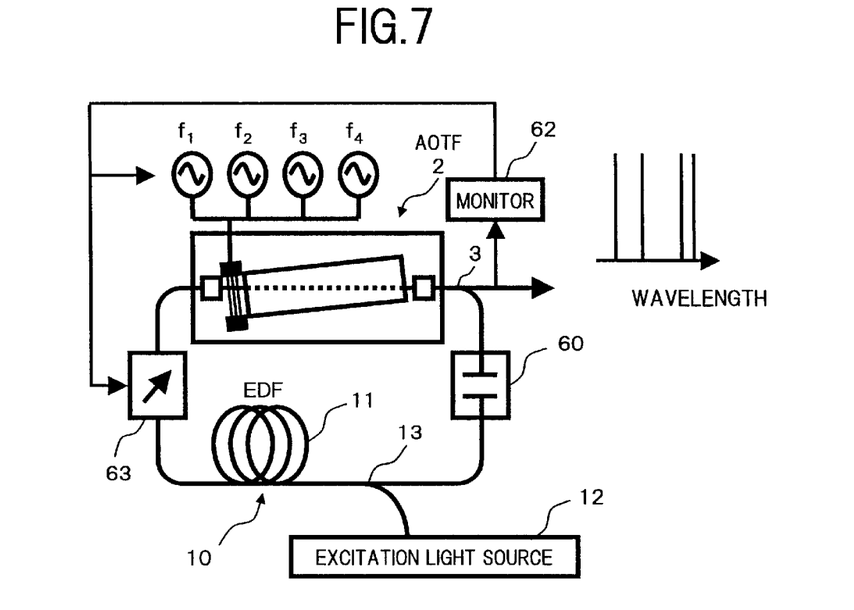
FIG. 7 is a plan view showing an exemplary constitution in a case of using an equalizer in the embodiment (2)

In the embodiment (2), the RF signals of the AOTF 2 have been controlled based on the detection result by the monitor 62 to flatten the output light levels, without providing an equalizer or the like within the ring resonator. However, as shown in FIG. 7, similarly to the conventional constitution, the constitution may be such that an equalizer such as variable attenuators corresponding to the respective wavelengths is inserted into the optical path of the ring resonator, so as to flatten the output light levels by the equalizer. In such a case, it is possible to control, based on the detection result by the monitor 62, both of the RF signals of the AOTF 2 and the equalizer, thereby enabling to flatten the output light levels with high precision. Note, the optical isolator has been omitted from the exemplary constitution in FIG. 7.

Figure 8:
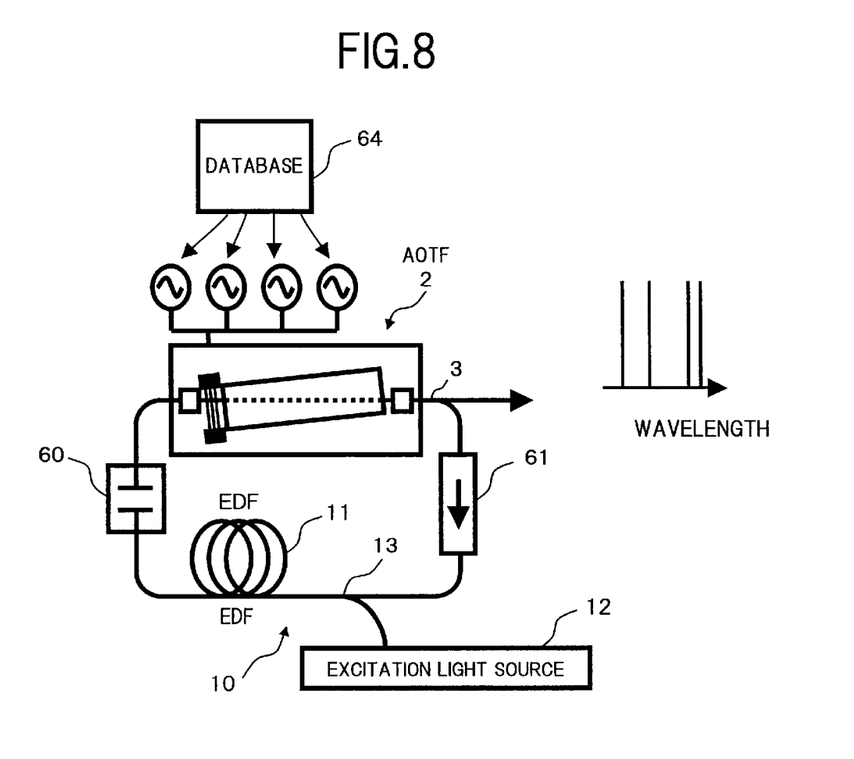
FIG. 8 is a plan view showing an exemplary constitution in a case of using a database in the embodiment (2)

Further, for example, as shown in FIG. 8, a database 64 for controlling the RF signals of the AOTF 2 may be disposed, instead of the monitor 62, to thereby correct the variation among the levels of output lights of respective wavelengths. This database 64 contains correction values for optical intensity in all oscillating patterns which have been previously obtained such as by measurement, so that the correction values in the database 64 are referred to corresponding to the respective oscillating patterns to control the intensities of the respective RF signals to be applied to the AOTF 2, thereby flattening the output light levels.

Next, there will be described an embodiment (3) of a multi-wavelength light source according to the present invention.

Figure 9:
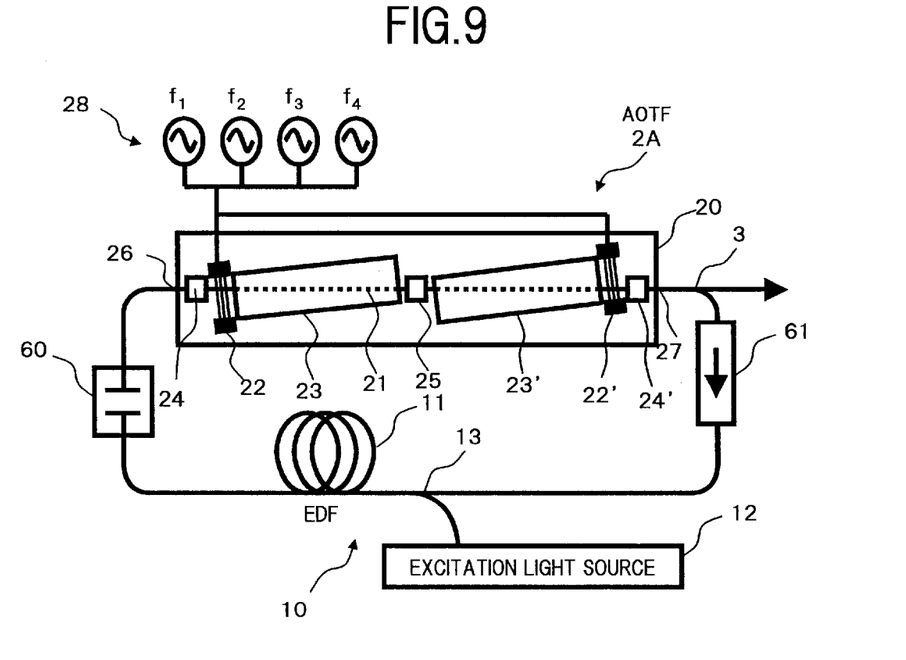
FIG. 9 is a plan view showing a constitution of an embodiment (3) of a multi-wavelength light source according to the present invention.

FIG. 9 is a plan view showing a constitution of the embodiment (3).

The multi-wavelength light source of FIG. 9 is to use an AOTF 2A of a two-staged constitution, and the remaining constitutions other than the AOTF 2A are the same as those in the embodiment (1) shown in FIG. 4.

The AOTF 2A is made up in a two-staged constitution by connecting in series two AOTF's. Specifically, the constitution at the former stage to be input with the output lights from the EDFA 10 is the same as that in the aforementioned AOTF 2, while the optical waveguide 21 at the latter stage of the mode branching device 25 is extended so that an IDT 22' and a SAW guide 23' at the latter stage are arranged in a symmetric manner to the IDT 22 and SAW guide 23 at the former stage. Further, a mode branching device 24' similar to the mode branching device 24 on the input port 26 side, is provided on the optical waveguide 21 between the IDT 22' and output port 27. Here, there has been shown an example wherein the AOTF elements at the former and latter stages are integrated into the single substrate 20. However, the constitution may be such that individual AOTF's are connected to each other by using an optical fiber or the like. The IDT's 22, 22' at the former and latter stages are commonly applied with the RF signals at the frequencies $f_1$ to $f_4$ generated at the RF-signal generating circuit 28. As a result, the surface acoustic waves generated by the former-stage side IDT 22 are propagated in the forward direction relative to the propagation direction of the lights, and the surface acoustic waves generated by the latter stage side IDT 22' are propagated in the reverse direction relative to the propagation direction of the lights.

In the multi-wavelength light source having the above constitution, the output lights from the EDFA 10 are input to the AOTF 2A via the input port 26 thereof, and the selected lights at the four waves that have been subjected to the mode conversion and Doppler-shift at the former stage AOTF element are further subjected to the mode conversion and Doppler-shift at the latter stage AOTF element, to be then output via the output port 27.

At this time, the amounts of Doppler shifts to be caused at the respective mode conversions at the former and latter stages are not cancelled but doubled. For example, considering a case where mode branching devices 24, 24' are set to branch the TE mode components and the mode branching device 25 is set to branch the TM mode components, the Doppler shift at the former stage becomes a frequency shift by +f as shown in the Table 1 since the lights and surface acoustic waves are propagated in the forward direction so that the mode conversion is made from the TE mode to the TM mode. Further, the Doppler shift at the latter stage also becomes a frequency shift by +f as shown in the Table 1 since the lights and surface acoustic waves are propagated in the reverse direction so that the mode conversion is made from the TM mode to the TE mode.

The lights of respective wavelengths selected at the AOTF 2A of two-staged constitution in the above manner sequentially pass through the optical isolator 61, EDFA 10 and periodic filter 60, to be again sent to the AOTF 2A. In this way, the lights at four waves selected at the AOTF 2A in accordance with the frequencies $f_1$ to $f_4$ of the RF signals, respectively, are circulated within the ring resonator, and by virtue of the Doppler shift caused in the AOTF 2A for each selected light, the oscillation in a single mode within the ring resonator is suppressed, to thereby realize the oscillation of multi-wavelength light.

According to the multi-wavelength light source of the embodiment (3), by using the AOTF 2A of two-staged constitution, it becomes possible to narrow the bandwidths of the lights selected by the AOTF 2A and simultaneously therewith to suppress side lobes, thereby enabling to obtain an excellent filter characteristic.

In the above embodiment (3), there has been described the constitution where the AOTF of two-staged constitution is applied to the constitution of the embodiment (1). However, it is also possible to apply the AOTF of two-staged constitution to the embodiment (2) having the function for controlling the output light levels.

Figure 10:
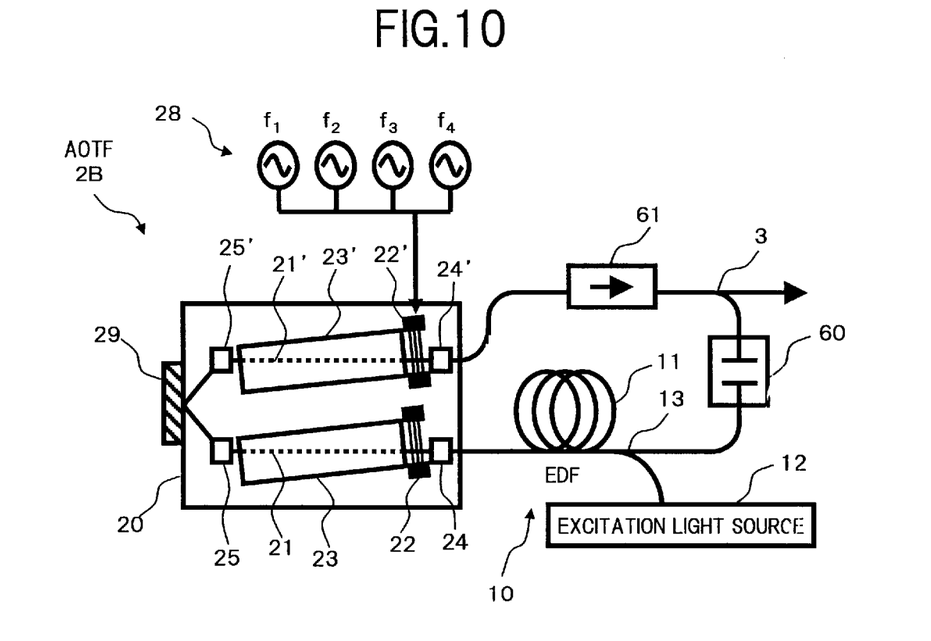
FIG. 10 is a plan view showing another exemplary constitution concerning the embodiment (3)

Further, there has been described the case where the two AOTF's are connected in series to each other. However, it is also possible to use an AOTF 2B having a folded two-staged constitution such as shown in FIG. 10. In this case, the lights having passed through the former stage AOTF element are totally reflected and folded by a reflecting section 29, and then sent to the latter stage AOTF element having the constitution symmetric to the former stage. By applying such an AOTF 2B of folded two-staged constitution, it becomes possible to shorten the length of the AOTF in the longitudinal direction along the optical waveguide.

Figure 11:
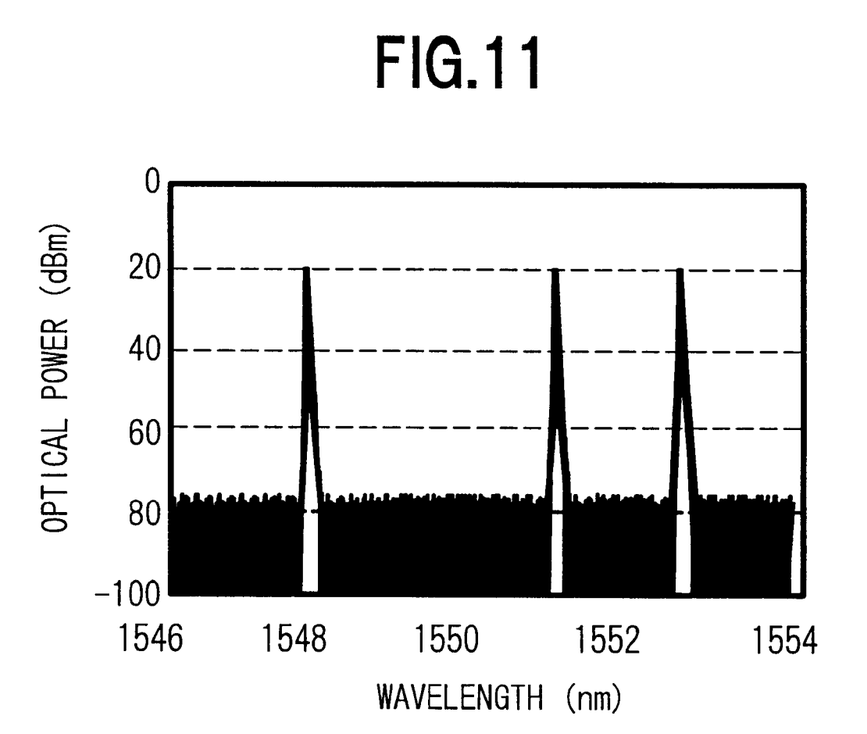
FIG. 11 is a graph showing an experimental result of a spectrum of output light of the multi-wavelength light source according to the present invention.

Note, shown in FIG. 11 is a spectrum of output lights measured in a case where the same multi-wavelength light source as the constitution of FIG. 10 is used to realize the oscillation of lights at three waves and to perform the flattening control of output light levels.

Next, there will be described an embodiment (4) of a multi-wavelength light source according to the present invention.

Figure 12:
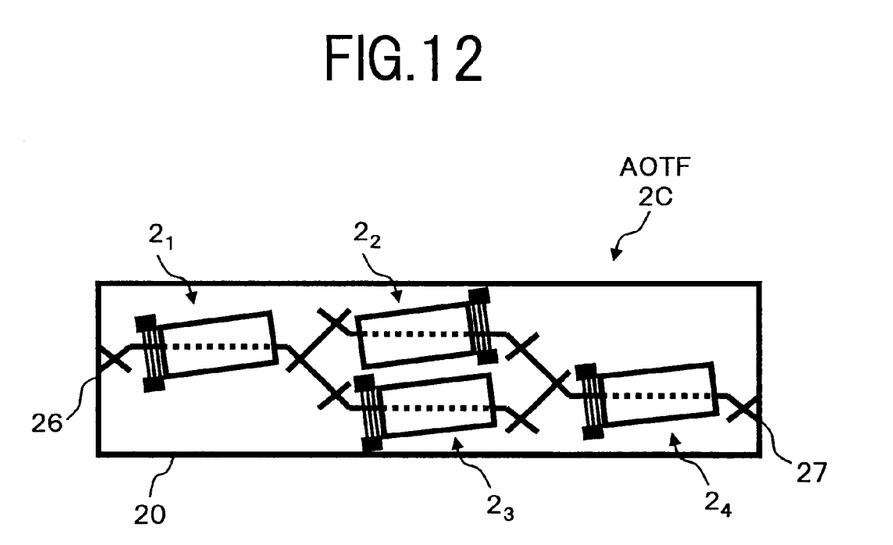
FIG. 12 is a plan view showing an essential constitution of an AOTF to be used in an embodiment (4) of a multi-wavelength light source according to the present invention.

FIG. 12 is a plan view showing an essential constitution example of an AOTF to be used for a multi-wavelength light source in the embodiment (4). Note, the whole constitution of the embodiment (4) is the same as that in the embodiment (1) or embodiment (2), so the explanation thereof shall be omitted.

As shown in FIG. 12, an AOTF 2C used for the multi-wavelength light source of the embodiment (4) has a constitution wherein the single substrate 20 is integrated with four AOTF's (hereinafter called "AOTF elements $2_1$ through $2_4$"), each of which has the same constitution as the AOTF 2 used in the embodiment (1) or the like, and by selectively using the respective AOTF elements $2_1$ through $2_4$, the oscillating operation of the multi-wavelength light source is made to be switchable between the oscillation at a single wavelength and the oscillation at multiple wavelengths.

The AOTF element $2_1$ arranged at the left side of the substrate 20 in FIG. 12 is set to be input with output lights such as from the EDFA 10 via the input port 26 so that the lights and surface acoustic waves are propagated in the forward direction. The mode branching device at the output side of the AOTF element $2_1$ guides the selected lights that have been subjected to the mode conversion into an optical waveguide extending to the AOTF element $2_2$ arranged at the central upper part of the substrate 20, and guides the transmitted lights that have not been subjected to the mode conversion, into an optical waveguide extending to the AOTF element $2_3$ side arranged at the central lower part of the substrate 20. The AOTF element $2_2$ is set to be input with the selected lights from the AOTF element $2_1$, so that the lights and surface acoustic waves are propagated in the reverse direction. The mode branching device at the output side of the AOTF element $2_2$ guides the selected lights that have been subjected to the mode conversion into an optical waveguide extending to the AOTF element $2_4$ arranged at the right side of the substrate 20. The AOTF element $2_3$ is set to be input with the transmitted lights from the AOTF element $2_1$, so that the lights and surface acoustic waves are propagated in the forward direction. The mode branching device at the output side of the AOTF element $2_3$ guides the selected lights that have been subjected to the mode conversion into an optical waveguide extending to the AOTF element $2_4$. The AOTF element $2_4$ is set to be input with the selected lights from the AOTF element $2_2$ or AOTF element $2_3$, so that the lights and surface acoustic waves are propagated in the forward direction. The mode branching device at the output side of this AOTF element $2_4$ outputs from the output port 27 the selected lights that have been subjected to the mode conversion.

The IDT's of the AOTF elements $2_1$ through $2_4$ are commonly applied with the RF signals at required frequencies generated at an RF signal generating circuit (not shown) for each pair, that is, a pair of the AOTF elements $2_1$, $2_2$ and a pair of AOTF elements $2_3$, $2_4$, via a circuit structure capable of switching between the pairs.

Note, the arrangement of the AOTF elements $2_1$ through $2_4$ within the substrate 20 is not limited to the above example. Further, although the AOTF elements $2_1$ through $2_4$ have been integrated into the single substrate 20, the AOTF's individually prepared may be connected to one another by using optical fibers or the like.

There will be specifically described an operation in the AOTF 2C of the above constitution.

Figure 13:
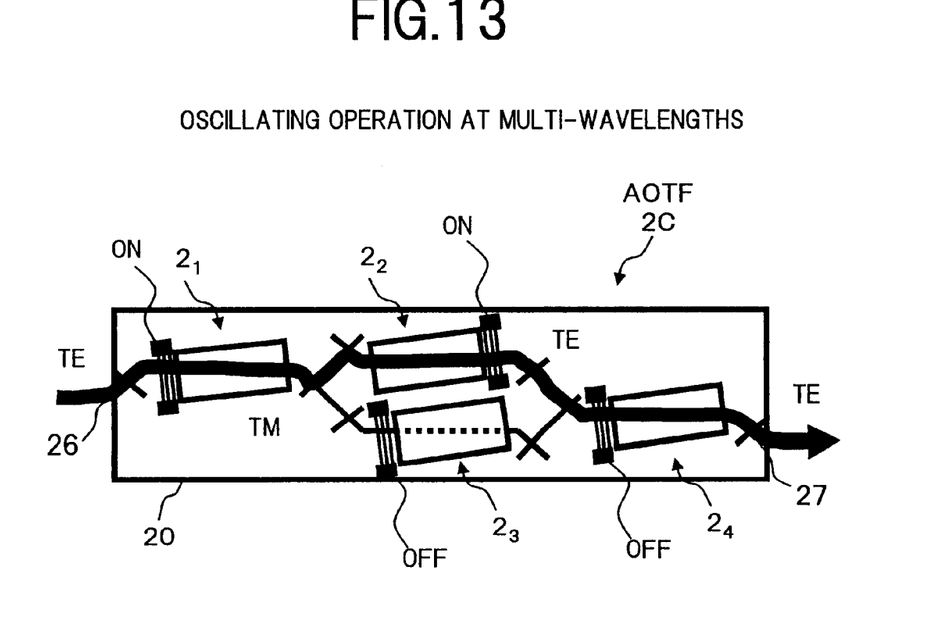
FIG. 13 is a view for explaining an operation of the AOTF at multi-wavelength oscillation in the embodiment (4)

In a case of operating the multi-wavelength light source at multiple wavelengths, as shown in FIG. 13, the AOTF elements $2_1$, $2_2$ are turned ON by commonly applying thereto the RF signals at required frequencies, while turning OFF the AOTF elements $2_3$, $2_4$ without applying the RF signals thereto. When, for example, the lights in the TE mode are input to the input port 26 in the above state, these input lights are propagated through a route represented by a thick line arrow in FIG. 13. Namely, among the input lights in the TE mode, the plural selected lights of the wavelengths corresponding to the frequencies of the RF signals are converted into the lights in the TM mode by the AOTF element $2_1$ in the ON state, and then sent to the AOTF element $2_2$. At the AOTF element $2_2$ in the ON state, the selected lights from the AOTF element $2_1$ are further converted into lights in the TE mode, and then sent to the AOTF element $2_4$. The amounts of Doppler shifts to be caused at the mode conversions in the AOTF elements $2_1$, $2_2$ are not cancelled but doubled, since the frequency shifts are in the same directions. At the AOTF element $2_4$ in the OFF state, the selected lights from the AOTF element $2_2$ pass through this element $2_4$ while keeping the TE mode without the mode conversion, and then output to the output port 27.

The lights of respective wavelengths selected at the AOTF 2C in the above manner are circulated by one cycle within the ring resonator and then again sent to the AOTF 2C. In this way, the lights of plural wavelengths selected at the AOTF 2C, respectively, corresponding to the frequencies of the RF signals to be commonly applied to the AOTF elements $2_1$, $2_2$, are circulated within the ring resonator, and by virtue of the Doppler shift caused in the AOTF 2C for each selected light, the oscillation in a single mode within the ring resonator is suppressed, to thereby realize the oscillation of multi-wavelength light.

Figure 14:
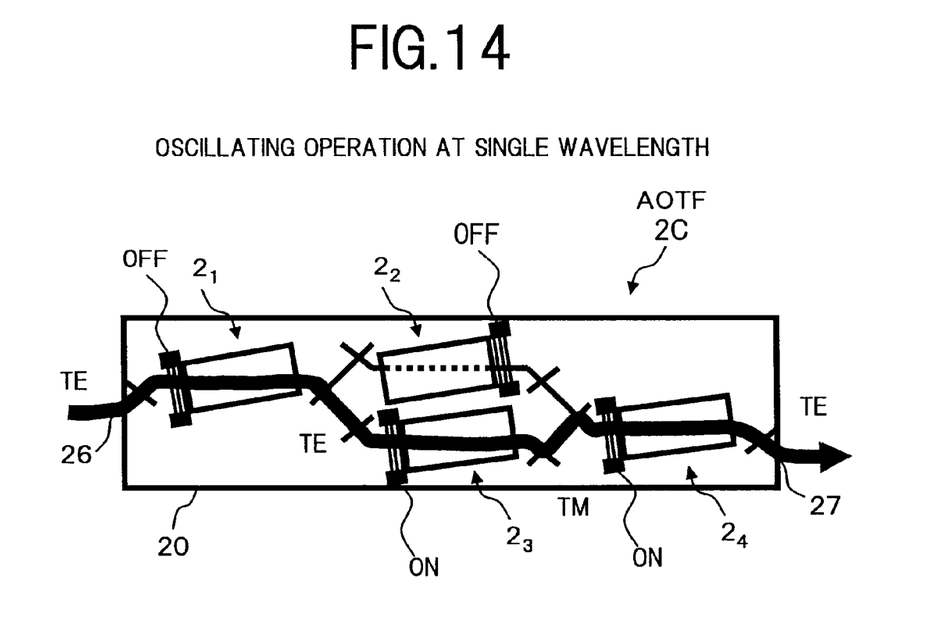
FIG. 14 is a view for explaining another operation of the AOTF at single-wavelength oscillation in the embodiment (4)

Meanwhile, in a case of operating the multi-wavelength light source at a single wavelength, as shown in FIG. 14, the AOTF elements 23, 24 are turned ON by commonly applying thereto the RF signal at a single frequency, while turning OFF the AOTF elements $2_1$, $2_2$ without applying the RF signals thereto. When the lights in the TE mode are input to the input port 26 in the above state, these input lights are propagated through a route represented by a thick line arrow in FIG. 14. Namely, the input lights in the TE mode pass through this element $2_1$ in the OFF state while keeping the TE mode without the mode conversion, to be sent to the AOTF element $2_3$. At the AOTF element $2_3$ in the ON state, among the lights passed from the AOTF element $2_1$, the selected light of a single wavelength corresponding to the frequency of the RF signal is converted into a light in the TM mode, and then sent to the AOTF element $2_4$. At the AOTF element $2_4$ in the ON state, the selected light from the AOTF element $2_3$ is further converted into a light in the TE mode, and then output to the output port 27. The amounts of Doppler shifts to be caused at the mode conversions at the AOTF elements $2_3$, $2_4$ are cancelled, since the frequency shifts are in the opposite directions to each other.

The light of the single wavelength selected at the AOTF 2C in the above manner is circulated within the ring resonator and then again sent to the AOTF 2C. In this way, the light of the single wavelength selected at the AOTF 2C corresponding to the frequency of the RF signal to be commonly applied to the AOTF elements $2_3$, $2_4$, is circulated within the ring resonator, and the amounts of Doppler shifts at the mode conversions are cancelled, to thereby realize the stable oscillation in a single mode within the ring resonator.

According to the multi-wavelength light source of the aforementioned embodiment (4), it becomes possible to realize a light source capable of electrically switching the multi-wavelength oscillating operation and the single-wavelength oscillating operation, by inserting the AOTF 2C into the ring resonator so as to selectively apply the RF signals to the AOTF elements $2_1$ through $2_4$.

Figure 15:
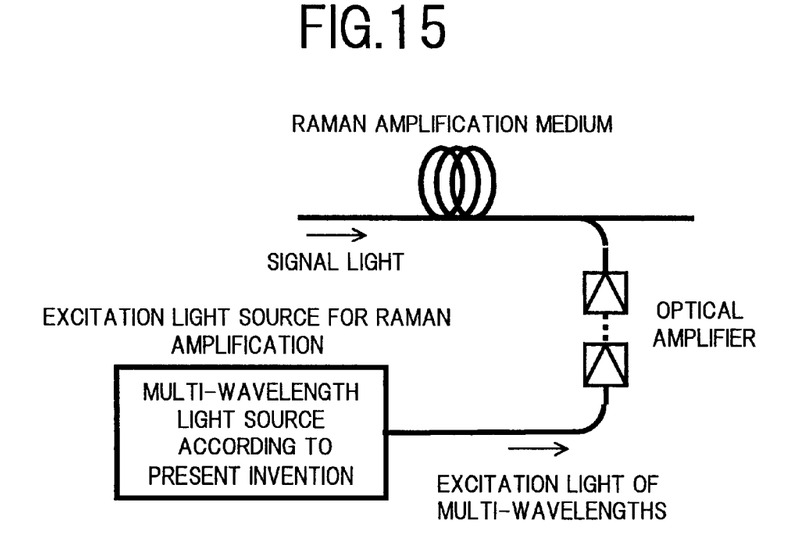
FIG. 15 is a block diagram showing an exemplary constitution in a case of using the multi-wavelength light source according to the present invention, as an excitation light source for Raman amplification.

The multi-wavelength light source using the aforementioned AOTF's according to the present invention can be used as a light source for transmission, a stand-by light source, a light source for insertion (in an optical add/drop device), a reference light source, a testing light source and the like, to be utilized in wavelength division multiplexed (WDM) optical communications, for example. Moreover, the multi-wavelength light source is also useful as a large-capacity excitation light source in a Raman amplifier. Note, FIG. 15 shows an exemplary constitution in a case of using the multi-wavelength light source according to the present invention as an excitation light source for generating excitation lights of plural wavelengths for Raman amplification. In this case, it becomes possible to amplify the signal lights being propagated through a Raman amplifying medium by setting the wavelengths of plural lights to be output from the multi-wavelength light source according to the present invention, corresponding to the wavelength bands of signal lights to be Raman amplified, and by amplifying the thus set lights of respective wavelengths up to required levels by optical amplifiers to supply the thus amplified lights to the Raman amplification medium.

What is claimed is:

1. A multi-wavelength light source having an optical amplifier on an optical path of a resonator, and generating a plurality of lights having different wavelengths, the lights being propagated through the resonator and oscillated, the light source comprising:

an acousto-optic tunable filter on the optical path of the resonator, wherein the acousto-optic tunable filter selects lights, from lights input thereto, having wavelengths corresponding to frequencies of a plurality of surface acoustic waves having different frequencies, and shifts the frequencies of the selected lights by Doppler shift when converting a mode of the selected lights to output the frequency shifted-lights to the optical path.

2. The multi-wavelength light source of claim 1, further comprising an optical output section, on the optical path of the resonator, outputting the lights having different wavelengths to an exterior of the multi-wavelength light source.

3. The multi-wavelength light source of claim 1, wherein the acousto-optic tunable filter comprises:

an optical waveguide formed on a substrate;

a signal generating section generating a plurality of electrical signals at different frequencies;

a surface acoustic wave generating section generating a plurality of surface acoustic waves having different frequencies on the substrate, corresponding to the plurality of electrical signals generated by the signal generating section, to propagate the plurality of surface acoustic waves within a predetermined region along the optical waveguide; and a mode branching section branching only the lights having different wavelengths for which polarization modes have been converted by acousto-optic effect based on the surface acoustic waves generated at the surface acoustic wave generating section, from the lights being propagated through the optical waveguide.

4. The multi-wavelength light source of claim 1, wherein the resonator is a ring resonator.

5. The multi-wavelength light source of claim 4, wherein the ring resonator is unidirectional with an optical isolator in the optical path.

6. The multi-wavelength light source of claim 1, wherein the resonator is a Fabry-Perot resonator.

7. The multi-wavelength light source of claim 1, wherein the optical amplifier amplifies and outputs the lights, which are propagated through a medium in which a rare earth element is doped with an amorphous material, by supplying an excitation light to the medium.

8. The multi-wavelength light source of claim 1, wherein the optical amplifier is a semiconductor optical amplifier.

9. The multi-wavelength light source of claim 1, further comprising an optical filter, having a periodic transmission wavelength characteristic, on the optical path of the resonator, wherein a transmission band of the optical filter has a bandwidth narrower than bandwidths of each of the lights with a respective wavelength that is selected by the acousto-optic tunable filter.

10. The multi-wavelength light source of claim 1, further comprising an optical power control section controlling an optical power of each light of the lights having different wavelengths that have been propagated through the resonator and oscillated.

11. The multi-wavelength light source of claim 10, wherein the optical power control section controls the optical powers at respective wavelengths by varying the intensities of the plurality of surface acoustic waves at different frequencies generated at the acousto-optic tunable filter, respectively.

12. The multi-wavelength light source of claim 10, further comprising an equalizer inserted into the optical path of the resonator, wherein the optical power control section controls the optical powers at respective wavelengths by varying losses corresponding to respective oscillation wavelengths of the equalizer.

13. The multi-wavelength light source of claim 10, further comprising a monitoring section detecting powers of the lights having different wavelengths that have been propagated through the resonator and oscillated, wherein the optical power control section controls the optical powers at respective wavelengths, in accordance with a detection result of the monitoring section.

14. The multi-wavelength light source of claim 10, further comprising a storing section storing correction values previously obtained in accordance with combinations of oscillation wavelengths, wherein the optical power control section controls the optical powers at respective wavelengths, in accordance with the correction values read out from the storing section corresponding to the combinations of oscillation wavelengths.

15. The multi-wavelength light source of claim 1, wherein the acousto-optic tunable filter has a plurality of acousto-optic tunable filter elements connected to each other in multiple stages, with the sum of frequency shifts of selected lights in the respective acousto-optic tunable filter elements becoming a value other than zero.

16. The multi-wavelength light source of claim 1, wherein the acousto-optic tunable filter has a plurality of acousto-optic tunable filter elements connected to each other in multiple stages, and selectively drives the acousto-optic tunable filter elements, to switch between a multi-wavelength oscillation state in which the frequency shifts of selected lights in the driven acousto-optic tunable filter elements become a value other than zero and a single-wavelength oscillation state in which the frequency shifts of selected lights in the driven acousto-optic tunable filter elements become zero.

* * * * *